United States Patent
Lin et al.

(10) Patent No.: US 9,391,023 B2
(45) Date of Patent: Jul. 12, 2016

(54) METHOD FOR PRODUCING SALICIDE AND A CARBON NANOTUBE METAL CONTACT

(71) Applicant: Taiwan Semiconductor Manufacturing Company Limited, Hsinchu (TW)

(72) Inventors: Yu-Hung Lin, Taichung (TW); Ching-Fu Yeh, Hsinchu (TW); Chih-Wei Chang, Hsin-Chu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/180,417

(22) Filed: Feb. 14, 2014

(65) Prior Publication Data

US 2015/0235958 A1    Aug. 20, 2015

(51) Int. Cl.
| | |
|---|---|
| *H01L 23/48* | (2006.01) |
| *H05K 7/02* | (2006.01) |
| *B01J 21/18* | (2006.01) |
| *B82B 1/00* | (2006.01) |
| *H01L 21/8234* | (2006.01) |
| *H01L 21/768* | (2006.01) |
| *H01L 23/532* | (2006.01) |
| *H01L 21/285* | (2006.01) |
| *H01L 21/3205* | (2006.01) |
| *H01L 23/485* | (2006.01) |

(52) U.S. Cl.
CPC .... *H01L 23/53276* (2013.01); *H01L 21/28518* (2013.01); *H01L 21/28562* (2013.01); *H01L 21/32053* (2013.01); *H01L 21/7684* (2013.01); *H01L 21/76879* (2013.01); *H01L 21/76883* (2013.01); *H01L 21/76897* (2013.01); *H01L 23/485* (2013.01)

(58) Field of Classification Search
CPC ............ H01L 23/53276; H01L 21/28518; H01L 21/28562; H01L 21/32053; H01L 21/3212; H01L 21/7684; H01L 21/76879; H01L 21/76883; H01L 21/76897; H01L 23/5226; H01L 23/53209
USPC .................................. 257/740–750
See application file for complete search history.

(56) References Cited

U.S. PATENT DOCUMENTS

| | | | | |
|---|---|---|---|---|
| 8,377,556 | B2 * | 2/2013 | Chan ........................ | B01J 23/75 428/408 |
| 2003/0179559 | A1 * | 9/2003 | Engelhardt ............ | B82Y 10/00 361/780 |
| 2005/0095780 | A1 * | 5/2005 | Gutsche .................. | H01L 28/91 438/243 |

(Continued)

OTHER PUBLICATIONS

Taiwanese Office Action; Application No. 103146202; dated Mar. 7, 2016.

*Primary Examiner* — Howard Weiss
*Assistant Examiner* — Nelson Garces
(74) *Attorney, Agent, or Firm* — Jones Day

(57) ABSTRACT

A method for producing a metal contact in a semiconductor device is disclosed. The method comprises depositing a catalyst layer in a via hole, forming a catalyst from the deposited catalyst layer, and growing a carbon nanotube structure above the catalyst in the via hole. The method further comprises forming salicide from the catalyst, applying a chemical mechanical polishing (CMP) process to the carbon nanotube structure to remove top layers of catalyst and nanotube material, and depositing metal material above the carbon nanotube structure. Growing a carbon nanotube structure comprises absorbing a precursor on a surface of the catalyst formed in the via hole, forming a metal-carbon alloy from the catalyst and the precursor, and growing a carbon nanotube structure vertically from the via bottom. The carbon nanotube structure comprises a plurality of carbon nanotubes wherein the diameters of the carbon nanotubes are limited by the catalyst size.

19 Claims, 5 Drawing Sheets

(56) References Cited

U.S. PATENT DOCUMENTS

| | | | |
|---|---|---|---|
| 2006/0071334 A1* | 4/2006 | Kawabata | B82Y 10/00 257/741 |
| 2008/0248945 A1* | 10/2008 | Kondo | B01J 23/745 502/184 |
| 2010/0244262 A1* | 9/2010 | Awano | B82Y 10/00 257/758 |

* cited by examiner

METHOD FOR PRODUCING SALICIDE AND A CARBON NANOTUBE METAL CONTACT

BACKGROUND

The technology described in this patent document relates generally methods for creating a metal contact (M0) in a semiconductor device and more specifically to methods for creating metal contacts using nanotube technology.

Scaling of semiconductor devices, such as a metal-oxide semiconductor field-effect transistor (MOSFET), has enabled continued improvement in speed, performance, density, and cost per unit function of integrated circuits over the past few decades. Improvements to the process for creating a metal contact can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
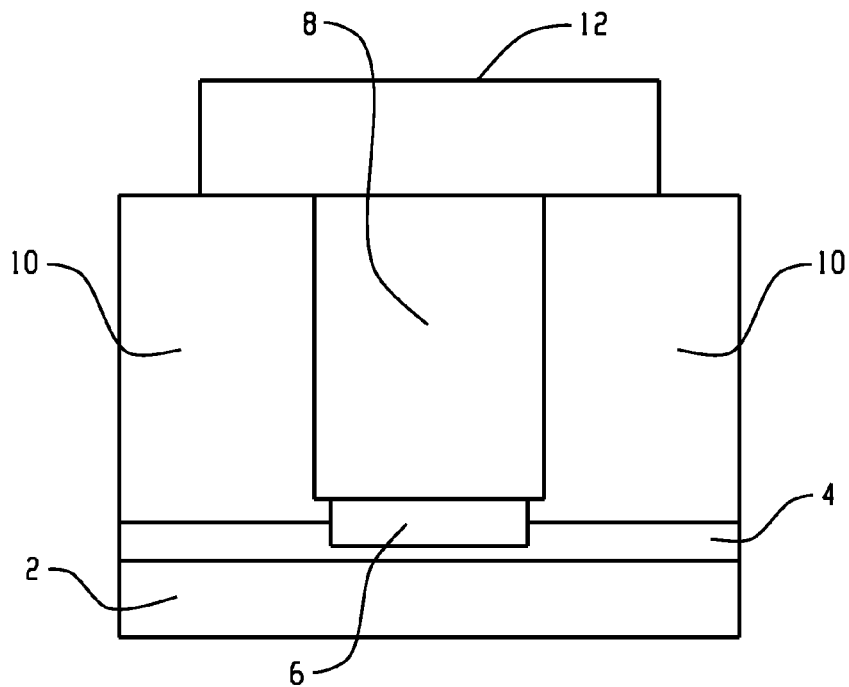
FIG. 1 is a block diagram of an example semiconductor device that is formed using nanotube technology, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a block diagram of an example semiconductor device that is formed using nanotube technology. The device is fabricated on a substrate 2. In this example, the substrate comprises bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonite; an alloy semiconductor including SiGe, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate 2 may include isolation regions, doped regions, and/or other features.

The example semiconductor device further includes a source region 4 in the substrate 2, a salicide region 6, a nanotube structure 8, an insulating or dielectric material 10, and a metal contact (M0) 12. The nanotube structure 8 in this example is oriented in a vertical direction and extends upwardly from the source region 4. The example nanotube structure 8 is formed from carbon and formed in a via hole in the semiconductor device between a terminal (a source region in this example) and the metal contact 12. The carbon nanotube structure 8 comprises a plurality of vertical carbon nanotubes grown within the via hole and that connects the salicide 6 with the metal contact 12. The carbon nanotubes are grown vertically under a temperature range with precursors.

A layer of salicide 6 is formed in the via hole immediately above the terminal 4. The salicide 6 is formed from a layer of metal material that has been deposited in the via hole, subjected to a thermal process to form a catalyst, and further subjected to an annealing process to convert the catalyst into the salicide 6.

Figure 2:
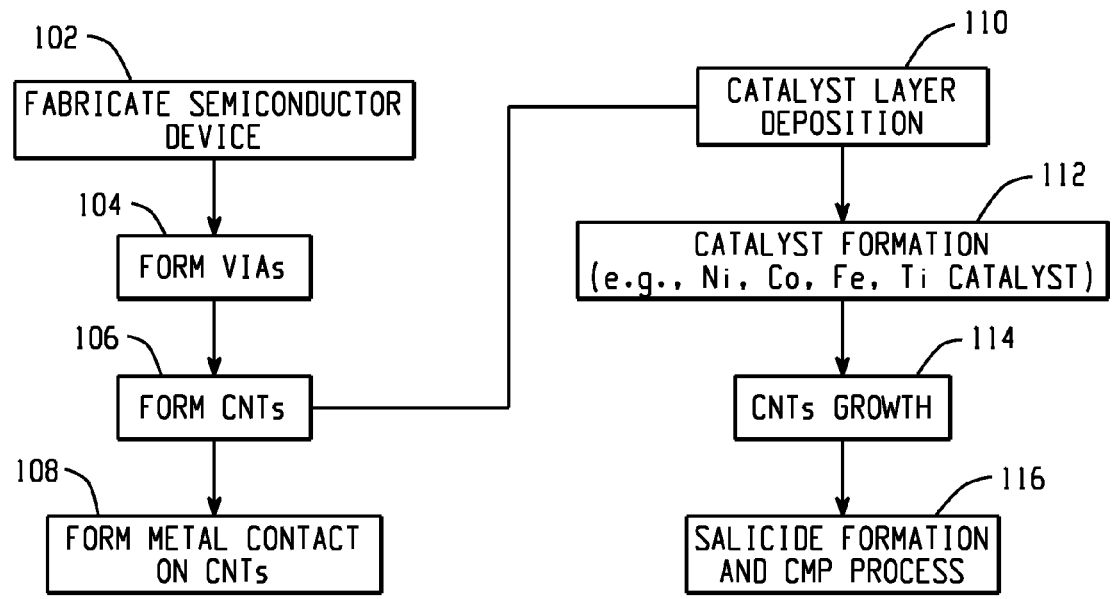
FIG. 2 is a process flow chart depicting an example method for generating a semiconductor device having a nanotube structure to connect a terminal with a metal contact, in accordance with some embodiments.

FIG. 2 is a process flow chart depicting an example method for generating a semiconductor device having a nanotube structure to connect a terminal with a metal contact. A semiconductor device is fabricated (operation 102) and at least one via hole is formed (operation 104) for subsequent metal contact (M0) connection. Carbon nanotubes (CNTs) are formed (operation 106) followed by metal contact formation (operation 108).

Forming the CNTs may involve depositing a catalyst layer (operation 110) in a via hole formed in operation 104. The deposited catalyst layer may include metal compounds such as Ni, Co, Fe, and Ti. The deposited catalyst layer may be deposited with a thickness of 2-30 nm, at a temperature between T=−30 to 450° C., and at a pressure P=5 to 100 mTorr.

After catalyst layer deposition, a catalyst is formed (operation 112) from the deposited catalyst layer metal materials such as Ni, Co, Fe, or Ti. A thermal process is applied the deposited catalyst layer metal materials to form the catalyst. The catalyst is formed in this example at a temperature between 300-600° C. by chemical vapor deposition (CVD) or annealing with 1-30 min under $H_2$ atmosphere at a pressure $P=10^{-3}$ to 10 Torr.

After catalyst formation, a carbon nanotube structure comprising a plurality of carbon nanotubes (CNTs) is grown above the catalyst in the via hole (operation 114). In this example, the CNTs grow vertically under a temperature of 300-800° C. using precursors of $CH_4$, $C_2H_2$, $C_2H_6$ or $C_2H_5OH$ with Ar and $H_2$ at a pressure $P=10^{-3}$ to $10^2$ Torr.

After nanotube growth, salicide is formed from the catalyst (operation 116). In this example, a thermal process is used to form salicide by annealing at a temperature of 400 to 900° C. and a pressure $P=10^{-3}$ to 10 mTorr. After salicide formation, a chemical mechanical polishing (CMP) process is applied to the carbon nanotube structure to remove top layers of catalyst and nanotube material.

Figure 3:
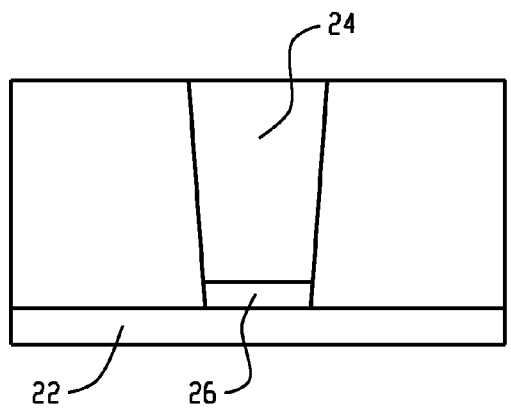
FIG. 3 is a diagram of an example semiconductor structure after catalyst layer deposition, in accordance with some embodiments.

FIG. 3 is a diagram of an example semiconductor structure after catalyst layer deposition (operation 110 of FIG. 2). Illustrated are a source terminal 22, a via hole 24, and a deposited catalyst layer 26.

Figure 4:
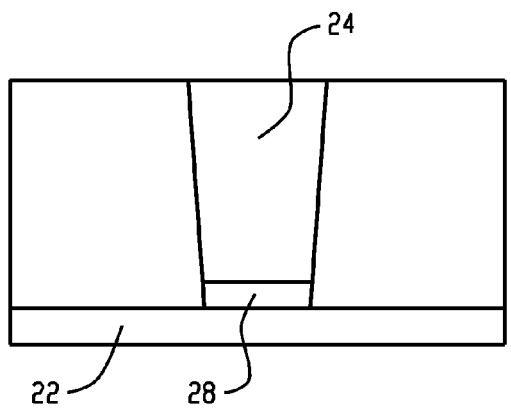
FIG. 4 is a diagram of an example semiconductor structure after catalyst formation, in accordance with some embodiments.

FIG. 4 is a diagram of the example semiconductor structure after catalyst formation (operation 112 of FIG. 2). Illustrated are a source terminal 22, a via hole 24, and a catalyst 28.

Figure 5:
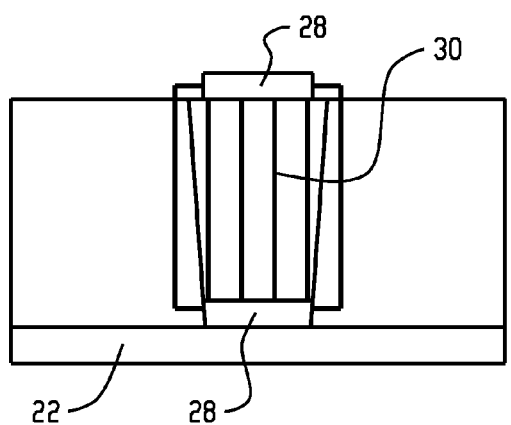
FIG. 5 is a diagram of an example semiconductor structure after carbon nanotube growth, in accordance with some embodiments.

FIG. 5 is a diagram of the example semiconductor structure after carbon nanotube growth (operation 114 of FIG. 2). Illustrated are a source terminal 22, the catalyst 28, and carbon nanotubes 30.

Figure 6:
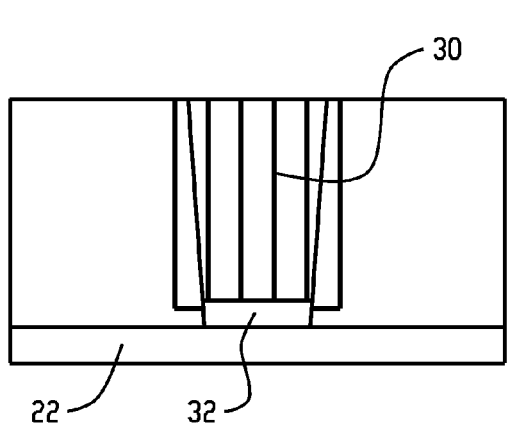
FIG. 6 is a diagram of an example semiconductor structure after salicide formation and CMP, in accordance with some embodiments.

FIG. 6 is a diagram of the example semiconductor structure after salicide formation and CMP (operation 116 of FIG. 2). Illustrated are a source terminal 22, carbon nanotubes 30, and salicide 32.

Figure 7:
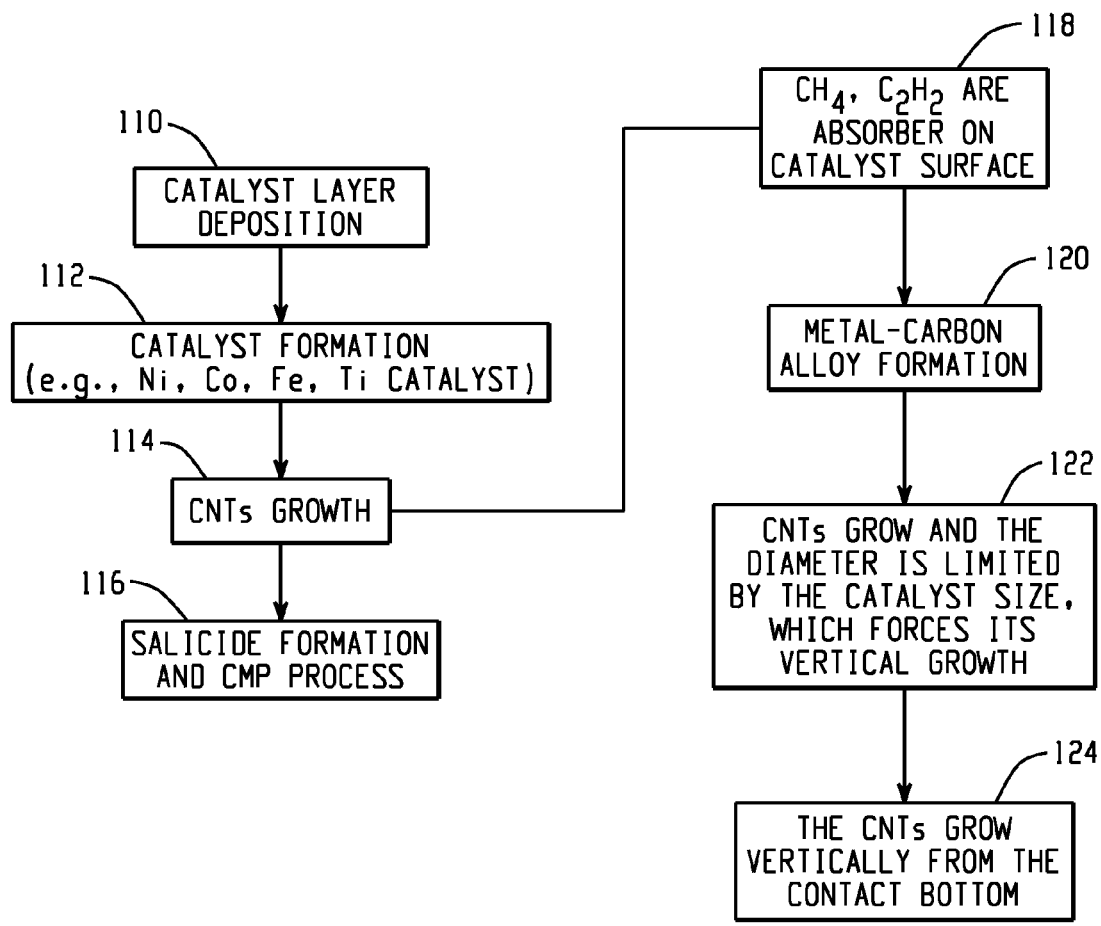
FIG. 7 is a process flow chart depicting an example method for growing carbon nanotubes, in accordance with some embodiments.
Figure 8:
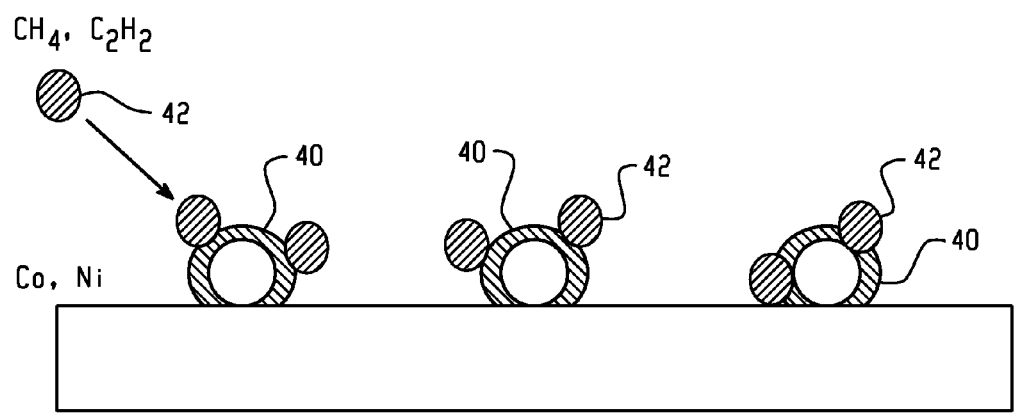
FIG. 8 is a diagram of an example semiconductor structure illustrating precursor absorption, in accordance with some embodiments.

FIG. 7 is a process flow chart depicting an example method for growing carbon nanotubes. In this example, precursors of $CH_4$, $C_2H_2$, $C_2H_6$ or $C_2H_5OH$ are absorbed on a catalyst surface (operation 118). FIG. 8 is a diagram of an example semiconductor structure illustrating precursor absorption (operation 118 of FIG. 7). Illustrated are the metal catalysts 40 with carbon-based precursors 42 being adsorbed on the surface of the catalysts 40.

Figure 9:
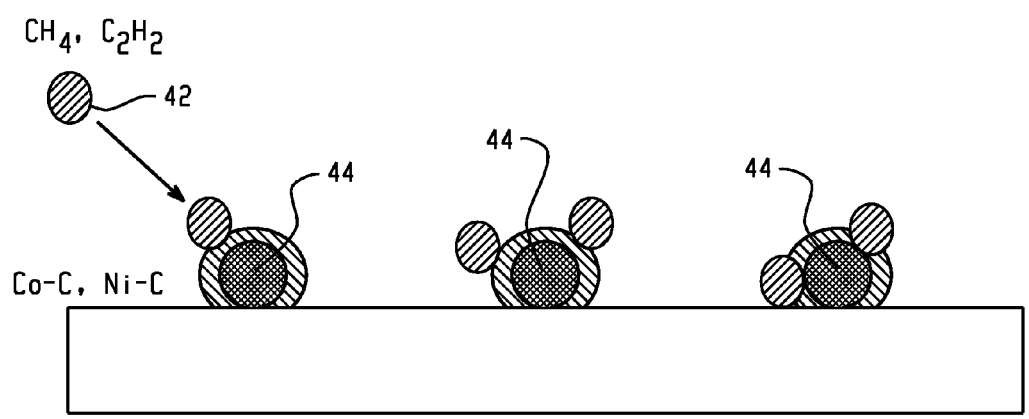
FIG. 9 is a diagram of an example semiconductor structure illustrating metal-carbon alloy formation, in accordance with some embodiments.

Referring back to FIG. 7, after precursor absorption, metal-carbon alloy formation takes place (operation 120). FIG. 9 is a diagram of an example semiconductor structure illustrating metal-carbon alloy formation (operation 120 of FIG. 7). Illustrated are formed metal-carbon alloy elements 44.

Figure 10:
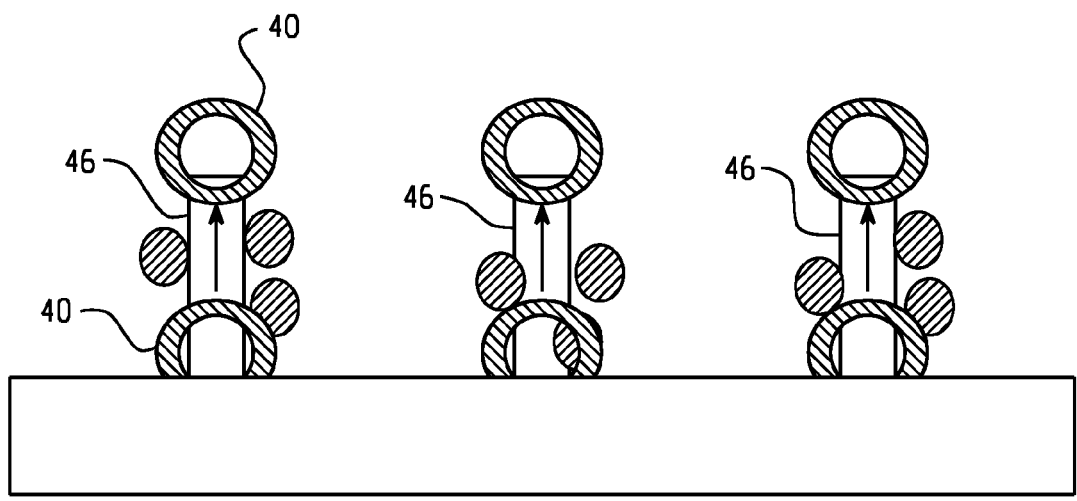
FIG. 10 is a diagram of an example semiconductor structure illustrating vertical growth of the CNTs, in accordance with some embodiments.

Referring back to FIG. 7, after metal-carbon alloy formation, the CNTs begin to grow vertically with the diameters of the CNTs limited by the catalyst size, which forces vertical growth (operation 122). FIG. 10 is a diagram of an example semiconductor structure illustrating vertical growth of the CNTs (operation 122 of FIG. 7). Illustrated are the CNTs 46 at the early stages of vertical growth.

Figure 11:
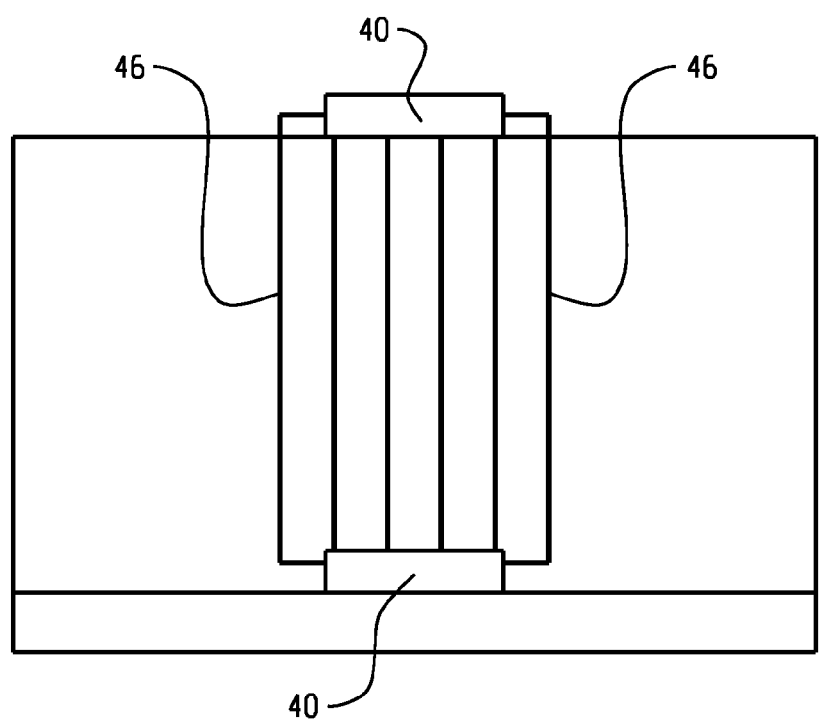
FIG. 11 is a diagram of an example semiconductor structure illustrating completion of the vertical growth of the CNTs from the contact bottom, in accordance with some embodiments.

Referring back to FIG. 7, the vertical CNT growth is completed (operation 124). FIG. 11 is a diagram of an example semiconductor structure illustrating completion of the vertical growth of the CNTs from the contact bottom (operation 124 of FIG. 7). Illustrated are the CNTs 46 after the completion of vertical growth. After CMP, a metal layer can be connected to the CNTs.

The use of CNTs to connect a terminal in a semiconductor device to a metal layer can allow a bottom-up process without overhang and necking bias concerns. Additionally, the catalyst of CNT formation, such as Ni, Co, Fe, Ti and $TiO_{2-X}$ (X=0-2) can be reacted with Si to form salicide. Under some conditions, it allows the tunneling effect of MIS structure of $CNTs/TiO_2/Si$, which also exhibits low $R_{csd}$ performance.

The examples illustrated herein may allow a full "bottom-up" process without W gap fill issue that may occur with some metallization processes. Also the metallization process may be simplified with "catalyst deposition to CNTs formation" without "W glue layer," "W seed layer" and "W CVD" process.

In one embodiment, disclosed is a method for producing a metal contact in a semiconductor device. The method comprises depositing a catalyst layer in a via hole, forming a catalyst from the deposited catalyst layer, and growing a carbon nanotube structure above the catalyst in the via hole. The method further comprises forming salicide from the catalyst, applying a chemical mechanical polishing (CMP) process to the carbon nanotube structure to remove top layers of catalyst and nanotube material, and depositing metal material above the carbon nanotube structure.

These aspects and other embodiments may include one or more of the following features. Depositing a catalyst layer may comprise depositing a metal material such as Nickel, Copper, Iron or Titanium. Depositing a catalyst layer may comprise depositing a layer of metal material with a thickness of 2-30 nm. Forming a catalyst may comprise utilizing a thermal process to form the catalyst by chemical vapor deposition (CVD) or annealing. Growing a carbon nanotube structure may comprise growing carbon nanotubes vertically under a temperature of 300-800 C. Growing a carbon nanotube structure may comprise growing carbon nanotubes vertically with precursors of $CH_4$, $C_2H_2$, $C_2H_6$ or $C_2H_5OH$. The method may further comprise absorbing the precursors on a surface of the catalyst. The method may further comprise forming a metal-carbon alloy. The diameters of the CNTs may be limited by catalyst size, which forces the vertical growth of the CNTs from the contact bottom. Forming salicide from the catalyst may comprise utilizing a thermal process to form salicide by annealing.

In another embodiment, a semiconductor device is disclosed. The semiconductor device comprises a via hole between a terminal in the semiconductor device and a metal contact, a layer of salicide formed in the via hole immediately above the terminal, and a carbon nanotube structure comprising a plurality of vertical carbon nanotubes grown within the via hole and connecting the salicide with the metal contact. The salicide is formed from a layer of metal material deposited in the via hole and subjected to a thermal process to form a catalyst. The layer of metal material is further subjected to a further annealing process to convert the catalyst into the salicide. The carbon nanotubes are grown vertically under a temperature range with precursors.

These aspects and other embodiments may include one or more of the following features. The carbon nanotube structure may be grown using a catalyst formed from a deposited layer of metal material. The deposited layer of metal material may comprise Nickel, Copper, Iron or Titanium. The deposited layer of metal material may have a thickness of 2-30 nm.

In another embodiment, a method for growing a carbon nanotube structure to connect a semiconductor terminal with a metal layer in a semiconductor device is disclosed. The method comprises forming a catalyst in a via hole in a semiconductor device, absorbing a precursor on a surface of the catalyst, forming a metal-carbon alloy from the catalyst and the precursor, and growing a carbon nanotube structure vertically from the via bottom. The carbon nanotube structure comprises a plurality of carbon nanotubes wherein the diameters of the carbon nanotubes are limited by the catalyst size.

These aspects and other embodiments may include one or more of the following features. Growing a carbon nanotube structure may comprise growing the plurality of carbon nanotubes vertically under a temperature of 300-800 C. The precursor may comprise $CH_4$, $C_2H_2$, $C_2H_6$ or $C_2H_5OH$. Forming salicide from the catalyst may be accomplished by utilizing an annealing process. Forming a catalyst may comprise depositing a layer of metal material comprising Nickel, Copper, Iron or Titanium. Forming a catalyst may comprise utilizing a thermal process to form the catalyst by chemical vapor deposition (CVD) or annealing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of producing a metal contact in a semiconductor device comprising:
   depositing a catalyst material layer in a via hole;
   forming a catalyst from the catalyst material layer;
   growing a carbon nanotube structure using the catalyst in the via hole;
   forming a portion of salicide from the catalyst after the growth of the carbon nanotube structure;
   applying a chemical mechanical polishing (CMP) process to the carbon nanotube structure to remove top layers of catalyst and nanotube material; and
   depositing metal material above the carbon nanotube structure.

2. The method of claim 1, wherein depositing the catalyst material layer comprises depositing a metal material selected from Nickel, Copper, Iron and Titanium.

3. The method of claim 2, wherein the depositing the catalyst material layer comprises depositing a layer of metal material with a thickness of 2-30 nm.

4. The method of claim 1, wherein the forming the catalyst comprises selectively utilizing a thermal process to form the catalyst by chemical vapor deposition (CVD) or annealing.

5. The method of claim 1, wherein the growing the carbon nanotube structure comprises growing carbon nanotubes vertically under a temperature of 300-800° C.

6. The method of claim 1, wherein the growing the carbon nanotube structure comprises growing carbon nanotubes (CNTs) vertically with precursors selected from $CH_4$, $C_2H_2$, $C_2H_6$ and $C_2H_5OH$.

7. The method of claim 6, further comprising absorbing the precursors over a surface of the catalyst.

8. The method of claim 7, further comprising forming a metal-carbon alloy.

9. The method of claim 6, wherein the CNTs have a diameter that is limited by a size of the catalyst.

10. The method of claim 1, wherein the forming the portion of the salicide comprises utilizing a thermal process to form the portion of the salicide by annealing.

11. A method for growing a carbon nanotube structure to connect a semiconductor terminal with a metal layer in a semiconductor device, the method comprising:
    forming a catalyst in a via hole in a semiconductor device;
    absorbing a precursor on a surface of the catalyst;
    forming a metal-carbon alloy from the catalyst and the precursor;
    growing a carbon nanotube structure vertically using the catalyst, the carbon nanotube structure comprising a plurality of carbon nanotubes wherein the diameters of the carbon nanotubes are limited by the catalyst size; and
    forming a portion of salicide from the catalyst after the growth of the carbon nanotube structure.

12. The method of claim 11, wherein the growing the carbon nanotube structure comprises growing the plurality of carbon nanotubes vertically under a temperature of 300-800° C.

13. The method of claim 11, wherein the precursor selectively comprises $CH_4$, $C_2H_2$, $C_2H_6$ and $C_2H_5OH$.

14. The method of claim 11, wherein the forming the catalyst comprises depositing a layer of metal material selected from Nickel, Copper, Iron and Titanium.

15. The method of claim 11, wherein the forming the catalyst comprises selectively utilizing a thermal process to form the catalyst by chemical vapor deposition (CVD) or annealing.

16. A method of forming a contact via of a semiconductor device, comprising:
    forming a via hole that enables contact to the semiconductor device;
    disposing a catalyst material layer in a bottom of the via hole applying a first process condition range;
    forming a carbon nanotube (CNT) catalyst from the catalyst material layer applying a second process condition range;
    growing a CNT structure substantially vertically in the via hole from the catalyst applying a third process condition range; and
    forming a portion of a salicide contact that enables electrical connection to the semiconductor device from the catalyst material layer applying a fourth process condition range after the growth of the CNT structure.

17. The method of claim 16, wherein the fourth process condition range comprises an upper temperature limit higher than that of the third process condition range; the third process condition range comprises an upper temperature limit higher than that of the second process condition range, and the second process condition range comprises an upper temperature limit higher than that of the first process condition range.

18. The method of claim 17, wherein the third process condition range comprises a temperature range of about 300° C. to about 800° C.

19. The method of claim 16, wherein disposing a catalyst material layer comprises selectively disposing a nickel, copper, iron, and titanium containing layer having a thickness of about 2 nm to about 30 nm.

* * * * *